US012777614B2

(12) United States Patent
Hatanaka et al.

(10) Patent No.: US 12,777,614 B2
(45) Date of Patent: Oct. 27, 2026

(54) COOLING DEVICE

(71) Applicant: NIDEC CORPORATION, Kyoto (JP)

(72) Inventors: Koji Hatanaka, Kyoto (JP); Masataka Matsuoka, Kyoto (JP); Takehito Tamaoka, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 145 days.

(21) Appl. No.: 18/954,595

(22) Filed: Nov. 21, 2024

(65) Prior Publication Data

US 2025/0176132 A1 May 29, 2025

(30) Foreign Application Priority Data

Nov. 24, 2023 (JP) ................................ 2023-198818

(51) Int. Cl.
*H05K 7/20* (2006.01)

(52) U.S. Cl.
CPC ..... *H05K 7/20254* (2013.01); *H05K 7/20272* (2013.01)

(58) Field of Classification Search
CPC ...................... H05K 7/20272; H05K 7/20254
See application file for complete search history.

(56) References Cited

U.S. PATENT DOCUMENTS

| | | | | |
|---|---|---|---|---|
| 11,725,890 | B2 | 8/2023 | Holden et al. | |
| 2003/0127859 | A1 * | 7/2003 | Isaksson ............... | F16L 41/086 285/374 |
| 2020/0348202 | A1 * | 11/2020 | Farkas .................. | H05K 1/162 |

* cited by examiner

*Primary Examiner* — Eric S Ruppert
(74) *Attorney, Agent, or Firm* — Keating & Bennett, LLP

(57) ABSTRACT

In a cooling device, a main body is capable of being in thermal contact with a heat source and includes a flow path for refrigerant. A protruding portion protrudes from one surface of the main body to one side in a predetermined direction, and includes a hole extending from an end portion on the one side in the predetermined direction to the flow path. A joint is inserted into the hole, and includes a flow path connected to the flow path of the main body. A restricting portion restricts movement of the joint. A leak sensor is mounted on a substrate, and is capable of detecting liquid leakage. The substrate includes a first portion that is positioned on the one surface and around the protruding portion. The restricting portion includes a second portion protruding from the end portion of the protruding portion in an intersecting direction.

10 Claims, 8 Drawing Sheets

COOLING DEVICE

CROSS-REFERENCE TO RELATED APPLICATIONS

The present application claims priority under 35 U.S.C. § 119 to Japanese Patent Application No. 2023-198818, filed on Nov. 24, 2023, the entire contents of which are hereby incorporated herein by reference.

1. FIELD OF THE INVENTION

The present disclosure relates to cooling devices.

2. BACKGROUND

Conventionally, as an example of a cooling device, a cooling module including a liquid detector is known.

In general, it is necessary to prevent breakage of components in a cooling device.

SUMMARY

A cooling device according to an example embodiment of the present disclosure includes a main body, a protruding portion, a joint, a restricting portion, a substrate, and a leak sensor. The main body is thermally contactable with a heat source and includes a flow path for refrigerant. The protruding portion protrudes from one surface of the main body to one side in a predetermined direction and, includes a hole that reaches the flow path from an end portion on the one side of the predetermined direction. The joint is inserted into the hole and includes a flow path connected to the flow path of the main body. The restricting portion is fixed to the end portion and restricts movement of the joint. The substrate is located on the one surface. The leak sensor is mounted on the substrate and is capable of detecting liquid leakage. The substrate includes a first portion located on the one surface and around the protruding portion. The restricting portion includes a second portion protruding from the end portion of the protruding portion in an intersecting direction intersecting the predetermined direction, on the one side of the predetermined direction with respect to the first portion.

The above and elements, other features, steps, characteristics and advantages of the present disclosure will become more apparent from the following detailed description of the example embodiments with reference to the attached drawings.

DETAILED DESCRIPTION

Figure 1:
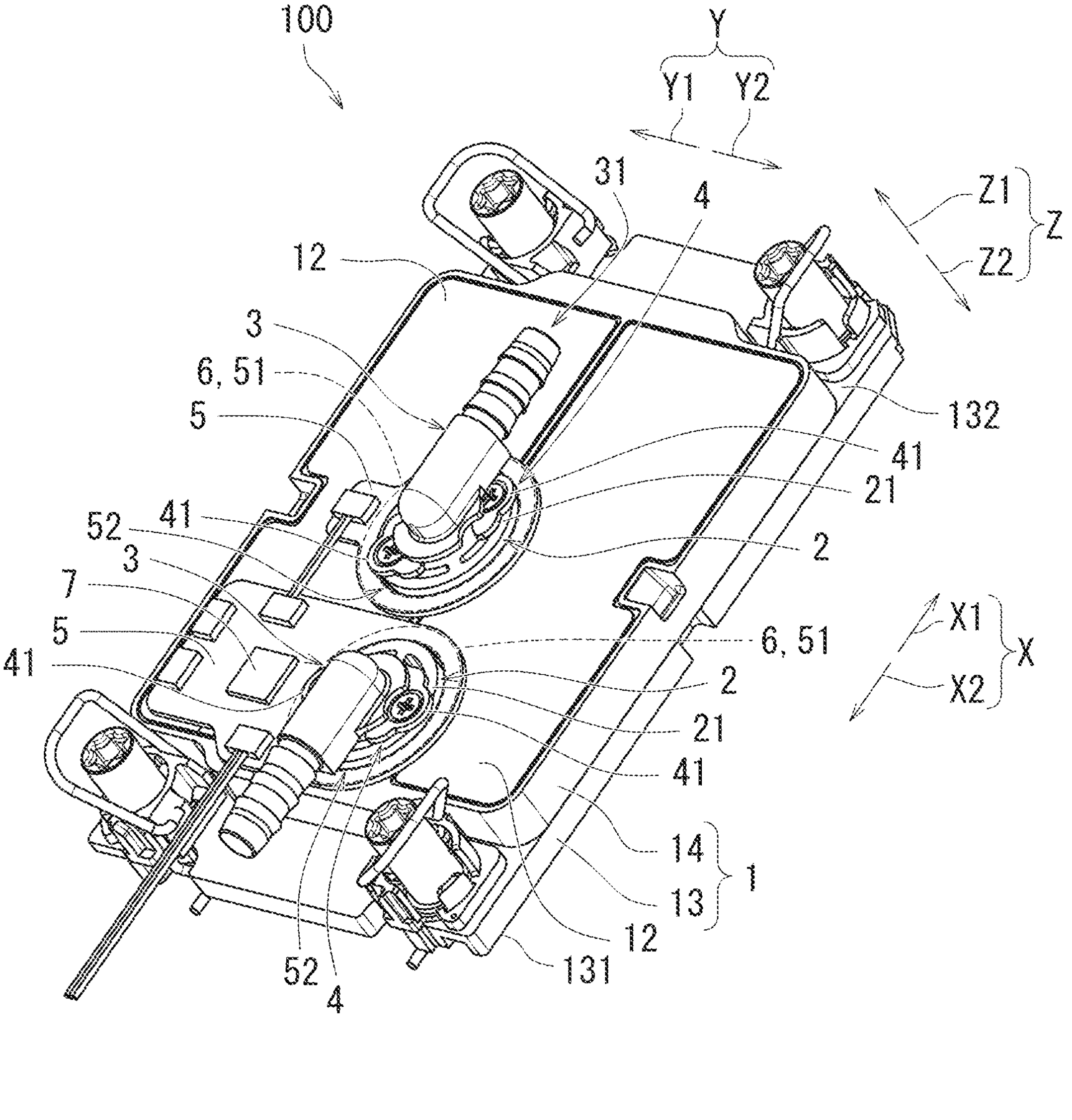
FIG. 1 is a perspective view of a cooling device according to an example embodiment of the present disclosure.

Hereinafter, example embodiments of the present disclosure will be described with reference to the drawings. In the drawings, the same or corresponding structures, elements, features, characteristics, etc., are denoted by the same reference numeral and description thereof will not be repeated.

In the example embodiments, a first direction Z, a second direction X, and a third direction Y intersecting each other are appropriately described for easy understanding. In each example embodiments, the term "intersecting" includes crossing lines, planes, or lines and planes at a right angle to each other, and crossing each other at a non-right angle within a range of a slight difference. A slight difference is a concept including, for example, tolerance and error.

One side and the other side of the first direction Z are referred to as one side Z1 of the first direction and the other side Z2 of the first direction, respectively. One side and the other side of the second direction X are referred to as one side X1 of the second direction and the other side X2 of the second direction, respectively. One side and the other side of the third direction Y are referred to as one side Y1 of the third direction and the other side Y2 of the third direction, respectively.

Figure 2:
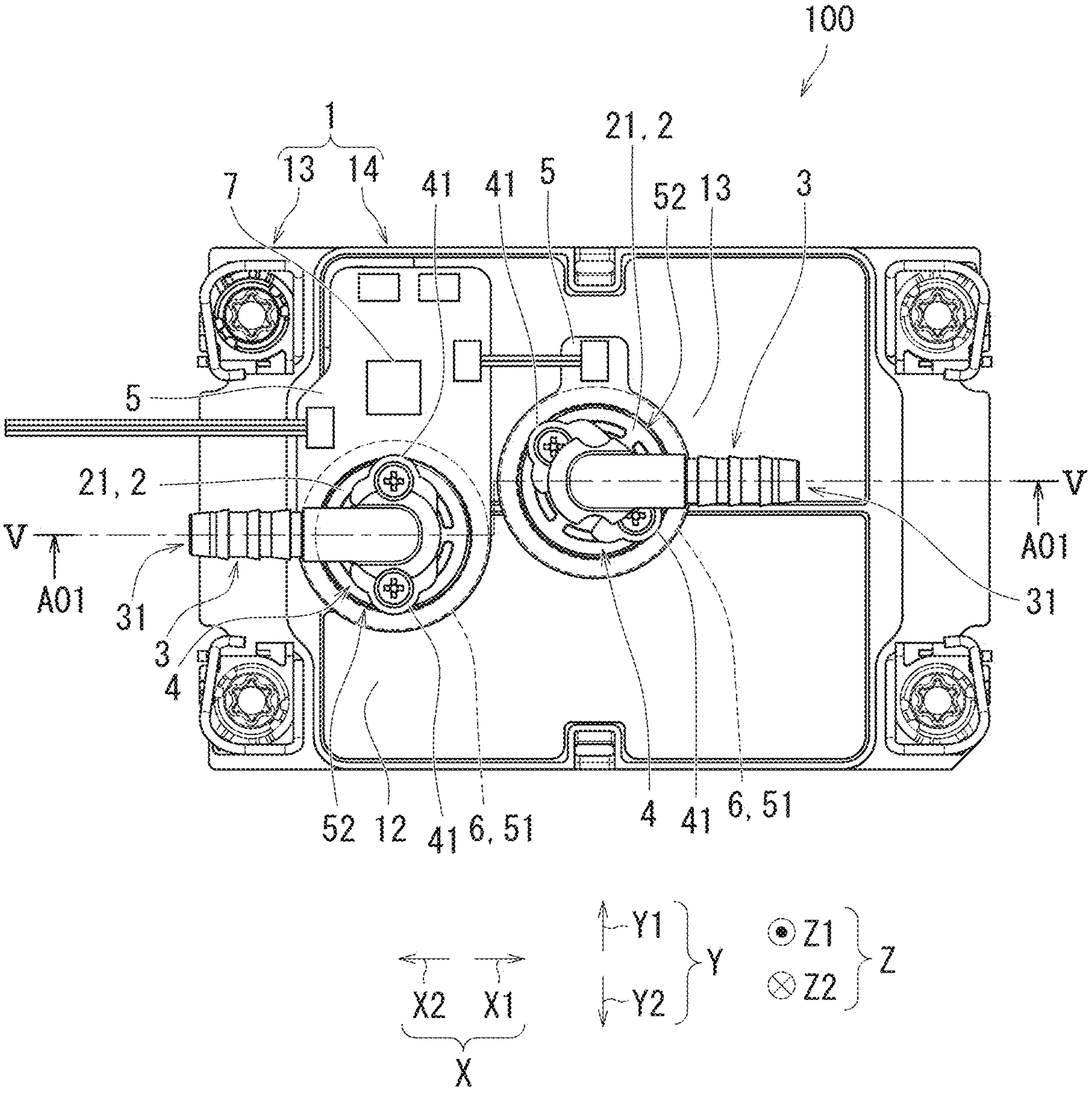
FIG. 2 is a plan view of the cooling device illustrated in FIG. 1 as viewed from one side Z1 of a first direction.
Figure 3:
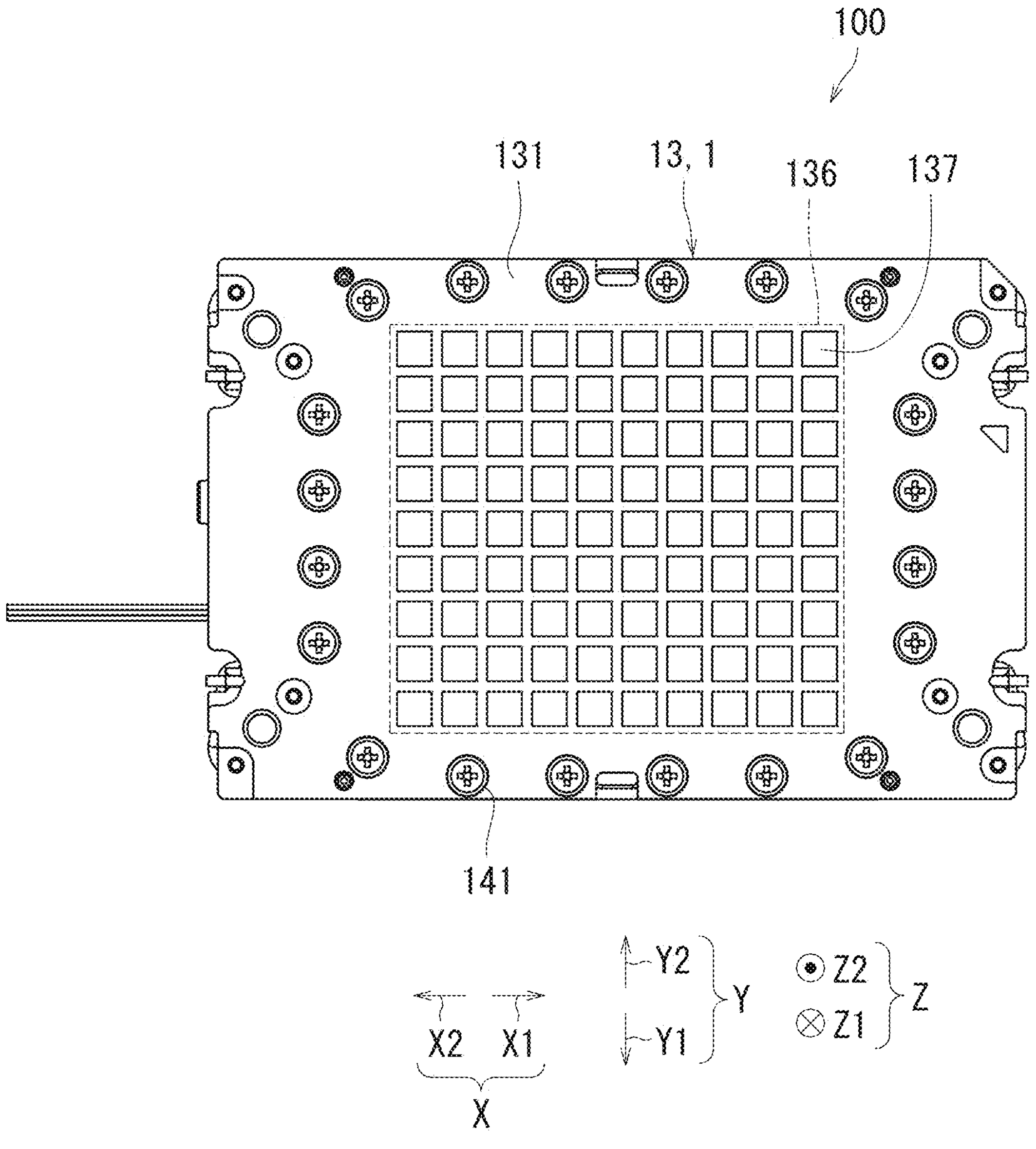
FIG. 3 is a plan view of the cooling device illustrated in FIG. 1 as viewed from the other side Z2 of the first direction.
Figure 4:
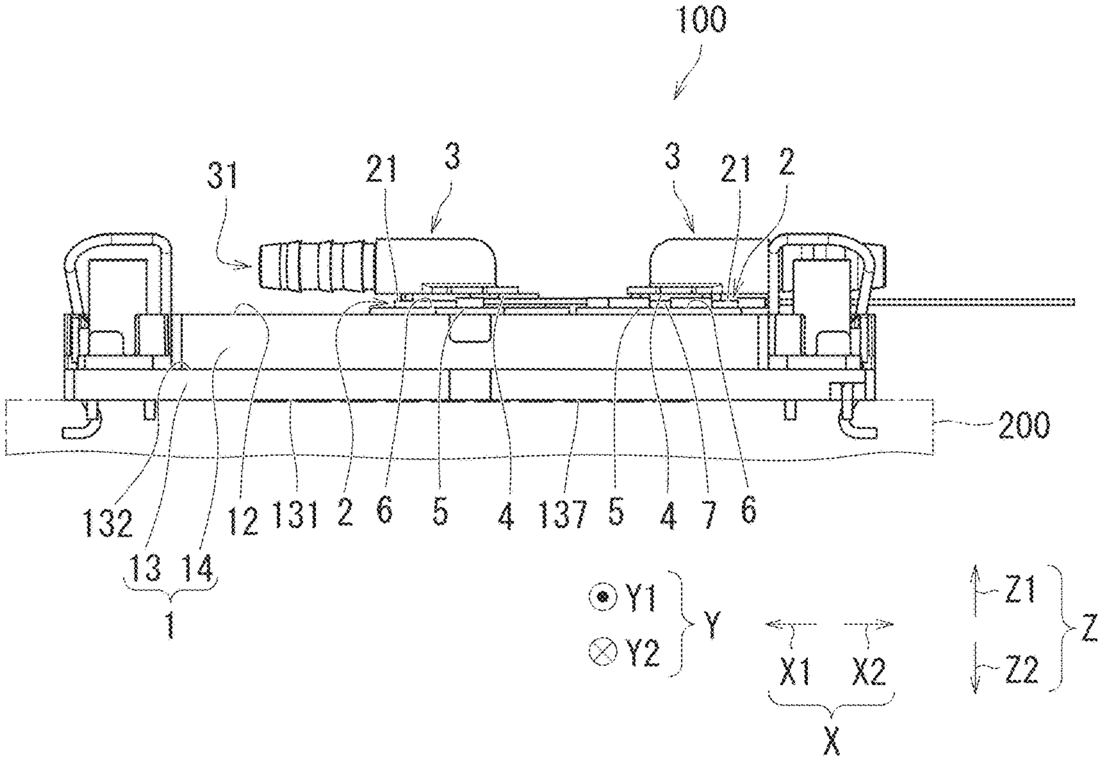
FIG. 4 is a side view of the cooling device illustrated in FIGS. 1 to 3 as viewed from one side Y1 of a third direction.
Figure 5:
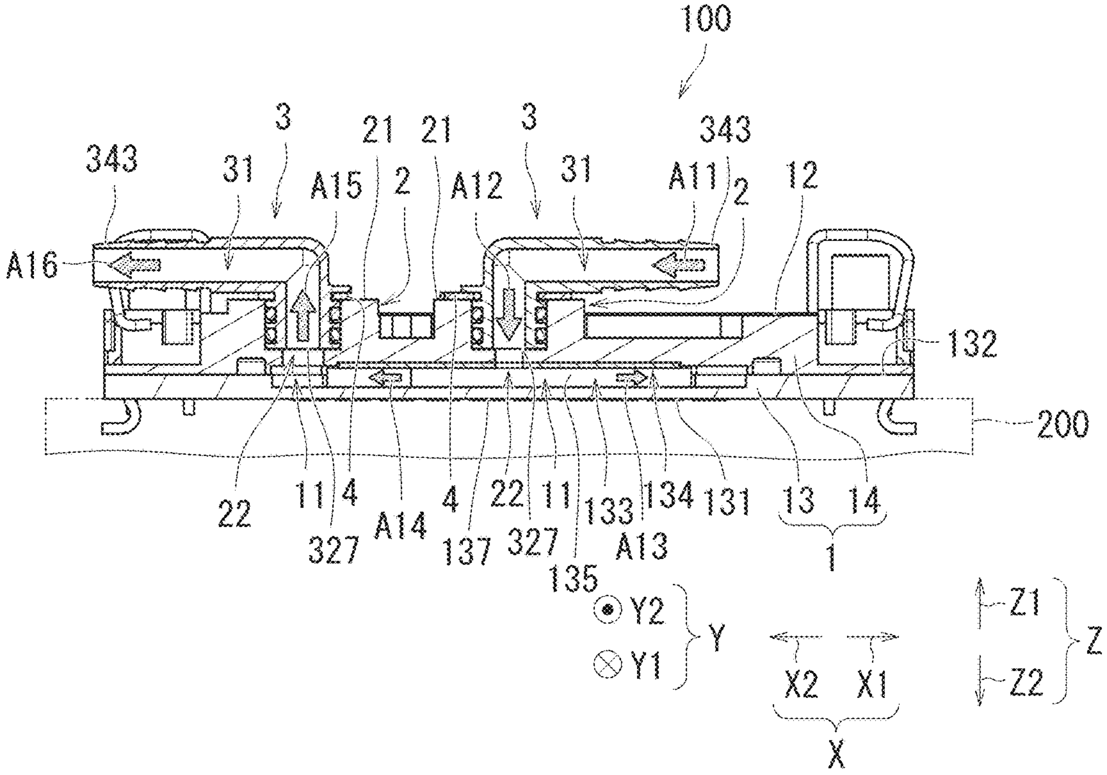
FIG. 5 is a cross-sectional view of the cooling device illustrated in FIG. 2 taken along line V-V as viewed from an arrow A01 side.

FIG. 1 is a perspective view illustrating a cooling device 100 according to an example embodiment of the present disclosure. FIGS. 2 and 3 are plan views of the cooling device 100 illustrated in FIG. 1 as viewed from the one side Z1 of the first direction and the other side Z2 of the first direction, respectively. FIG. 4 is a side view of the cooling device 100 illustrated in FIGS. 1 to 3 as viewed from the one side Y1 of the third direction. FIG. 5 is a cross-sectional view of the cooling device 100 illustrated in FIG. 2 taken along line V-V as viewed from an arrow A01 side.

As illustrated in FIGS. 1 to 5, the cooling device 100 includes a main body 1, at least one protruding portion 2, at least one joint 3, at least one restricting portion 4, at least one substrate 5, a leak sensor 6, and a controller 7.

The main body 1 is thermally contactable with a heat source 200 (see FIG. 4) and has a flow path 11 for refrigerant (see FIG. 5). The protruding portion 2 protrudes from one surface 12 of the main body 1 to the one side Z1 in the first direction. The one side Z1 in the first direction is an example of a "predetermined direction" in the present disclosure. The protruding portion 2 has a hole 22 (see FIG. 5) extending from an end portion 21 of the protruding portion 2 on the one side Z1 of the first direction to the flow path 11 of the main body 1. The joint 3 is inserted into the hole 22. The joint 3 has a flow path 31. The flow path 31 is connected to the flow path 11 of the main body 1. The restricting portion 4 is fixed to the end portion 21 of the protruding portion 2. The restricting portion 4 restricts the movement of the joint 3. Specifically, the restricting portion 4 restricts the movement of the joint 3 to the one side Z1 in the first direction. The substrate 5 is located on the one surface 12 of the main body 1 (see FIG. 1 and elsewhere). The leak sensor 6 is mounted on the substrate 5. The leak sensor 6 can detect liquid leakage. Specifically, the leak sensor 6 is schematically indicated by a broken line in FIG. 1 and elsewhere, and can detect liquid that may leak from the gap between the joint 3 and the protruding portion 2. The substrate 5 has a first portion 51. The first portion 51 is a portion located on the one surface 12 and positioned around the protruding portion 2. In the example embodiment, the first portion 51 is a region surrounded by a broken line in FIGS. 1 and 2. The restricting portion 4 has a second portion 41 (See FIGS. 1, 9, and elsewhere). As illustrated in FIG. 1 and elsewhere, the second portion 41 protrudes from the end portion 21 of the protruding portion 2 on the one side Z1 of the first direction with respect to the first portion 51. The second portion 41 protrudes in an intersecting direction intersecting the first direction Z. The intersecting direction is a direction parallel to the second direction X and the third direction Y.

According to the above configuration, breakage of components of the cooling device 100 is suppressed. Specifically, when the restricting portion 4 is fixed to the end portion 21 in the manufacturing process, the second portion 41 of the restricting portion 4 is less likely to come into contact with the leak sensor 6 and the first portion 51 of the substrate 5. Therefore, breakage of the leak sensor 6 and the first portion 51, that is, components of the cooling device 100 is suppressed.

As illustrated in FIG. 1 and the like, the end portion 21 is preferably located closer to the one side Z1 of the first direction than the substrate 5. This makes it difficult for the leak sensor 6 and the substrate 5 to come into contact with the restricting portion 4.

The substrate 5 preferably has a hole 52 through which the protruding portion 2 penetrates (see FIG. 1 and elsewhere). As a result, the position of the substrate 5 with respect to the protruding portion 2 can be easily determined.

The first portion 51 and the second portion 41 preferably oppose each other in the first direction Z. The movement of the leak sensor 6 and the substrate 5 in the first direction Z is restricted by the restricting portion 4.

The restricting portion 4 preferably has a plurality of second portions 41. This further restricts the movement of the leak sensor 6 in the first direction Z.

In another example embodiment, the number of the protruding portions 2, the joints 3, the restricting portions 4, the substrates 5, and the leak sensors 6 is plural. As a result, the leak sensor 6 and the first portion 51 of each substrate 5 are protected by the second portion 41 of the corresponding restricting portion 4.

Specifically, the main body 1 can be in thermal contact with the heat source 200 (see FIG. 4) and has the flow path 11 for refrigerant (see FIG. 5). The plurality of protruding portions 2 protrude from the one surface 12 of the main body 1 to the one side Z1 in the first direction. The protruding portions 2 have holes 22 (see FIG. 5) extending from the end portions 21 of the protruding portions 2 on the one side Z1 of the first direction to the flow path 11 of the main body 1. The plurality of joints 3 are inserted into the holes 22. The joints 3 have flow paths 31. The plurality of restricting portions 4 are fixed to the end portions 21 of the protruding portions 2. The restricting portions 4 restrict the movement of the joints 3. The plurality of substrates 5 are located on the one surface 12 of the main body 1 (see FIG. 1 and elsewhere). The plurality of leak sensors 6 are mounted on the substrates 5. The leak sensors 6 can detect liquid leakage. Each of the substrates 5 has the first portion 51. The first portion 51 is a portion on the one surface 12 and positioned around the protruding portion 2. Each of the restricting portions 4 has the second portion 41 (see FIGS. 1, 9, and elsewhere). As illustrated in FIG. 1 and elsewhere, each of the second portions 41 protrudes from the end portion 21 of the protruding portion 2 on the one side Z1 of the first direction with respect to the first portion 51. The second portion 41 protrudes in an intersecting direction intersecting the first direction Z.

The controller 7 controls the plurality of leak sensors 6. The controller 7 is preferably mounted on one of the substrates 5. Since only one controller 7 is required, the manufacturing cost of the cooling device 100 is suppressed.

Figure 6:
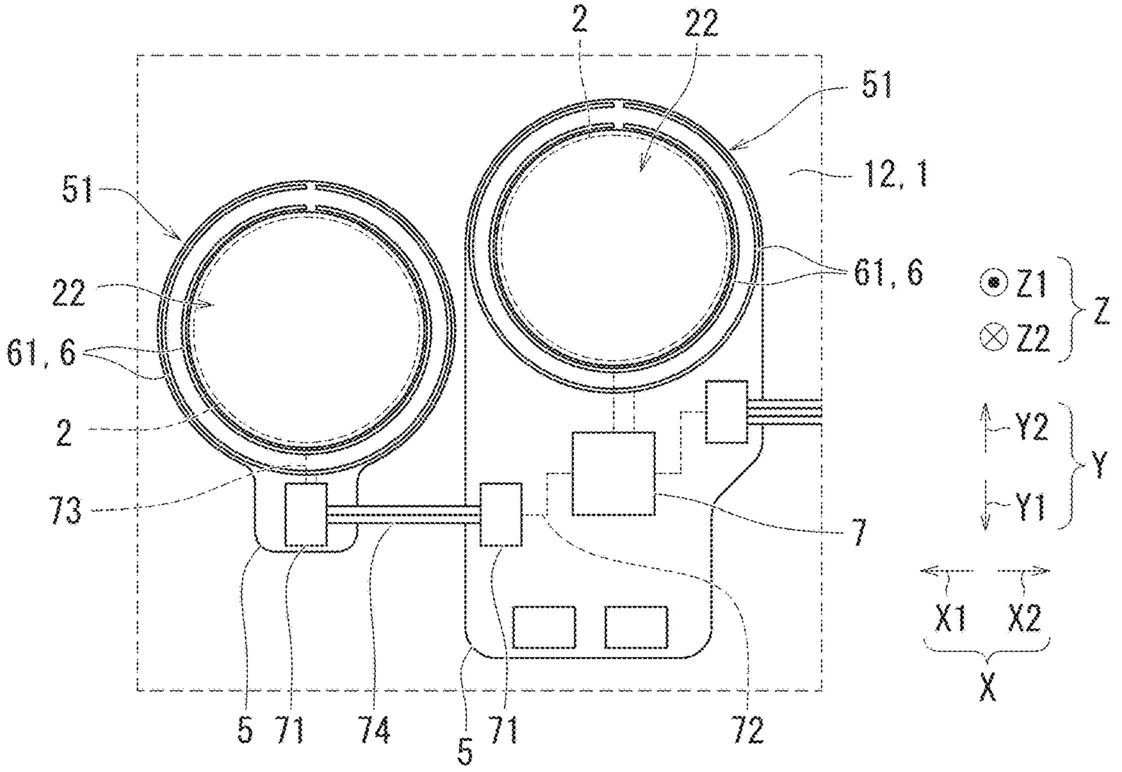
FIG. 6 is a schematic plan view of a plurality of substrates 5 illustrated in FIG. 1 as viewed from the one side Z1 of the first direction.

FIG. 6 is a schematic plan view of the plurality of substrates 5 illustrated in FIG. 1 as viewed from the one side Z1 of the first direction. In FIG. 6, at least one joint 3 and at least one restricting portion 4 are not illustrated from the viewpoint of clarifying the substrate 5 and the leak sensor 6. The outer shape of the protruding portion 2 is indicated by a broken line. As illustrated in FIG. 6, it is preferable that the controller 7 is mounted on one of the substrates 5, and an electrode 61 included in the leak sensor 6 is formed. The controller 7 and the electrode 61 of the leak sensor 6 is laid out on the same substrate 5. As a result, the limited one surface 12 of the main body 1 is efficiently used as compared with a case where the controller 7 and the electrode 61 are mounted on different substrates.

The electrode 61 is preferably formed at a portion on the one surface 12 and around the protruding portion 2 in one of the plurality of substrates 5. In the example embodiment, the electrode 61 is formed in the first portion 51. The controller 7 is preferably spaced away from the electrode 61 on the one surface 12 of the plurality of substrates 5. The formation range of the electrode 61 is limited to the periphery of the protruding portion 2 on the one surface 12. Therefore, a region where the controller 7 is mounted can be easily secured on the substrate 5, and as a result, the substrate 5 is downsized.

Since the size of the substrate 5 can be reduced, the following effects can also be obtained. That is, it is possible to suppress interference with members and components provided on the one surface 12. In addition, since a logo or a mark can be displayed on the one surface 12, the space of the one surface 12 can be effectively used.

Figure 7:
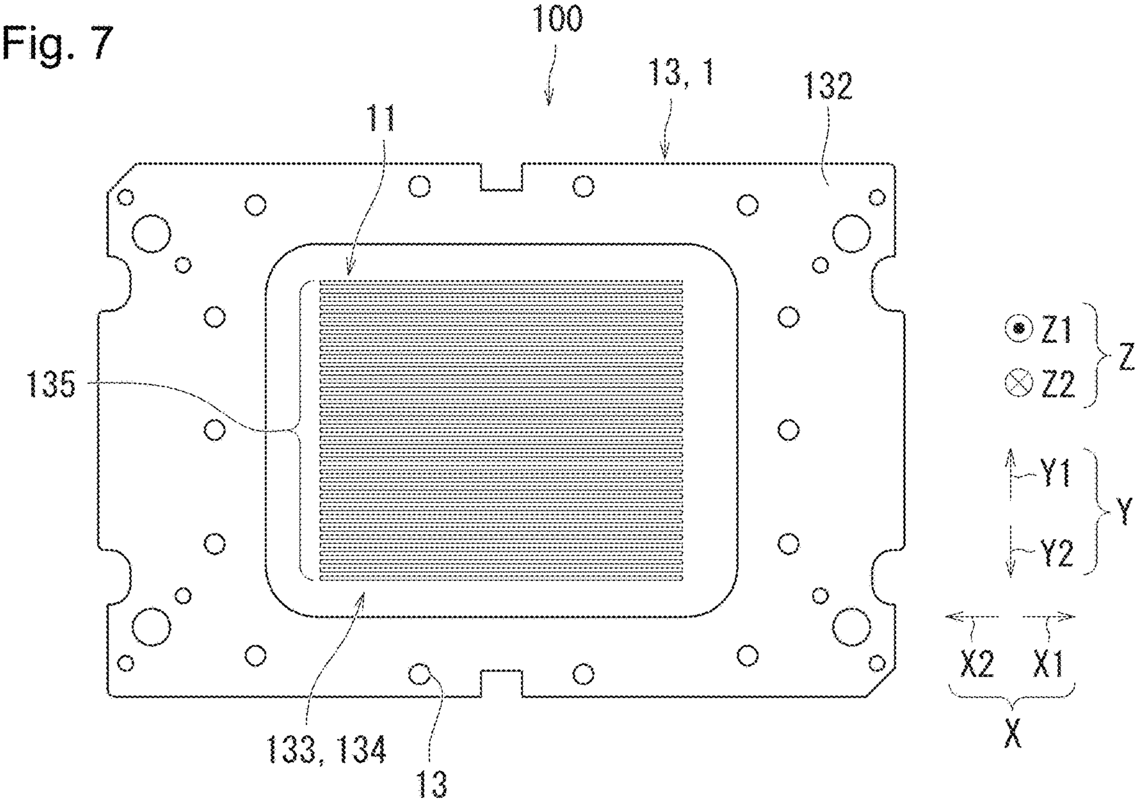
FIG. 7 is a plan view of a cold plate 13 illustrated in FIG. 1 as viewed from the one side Z1 of the first direction.
Figure 8:
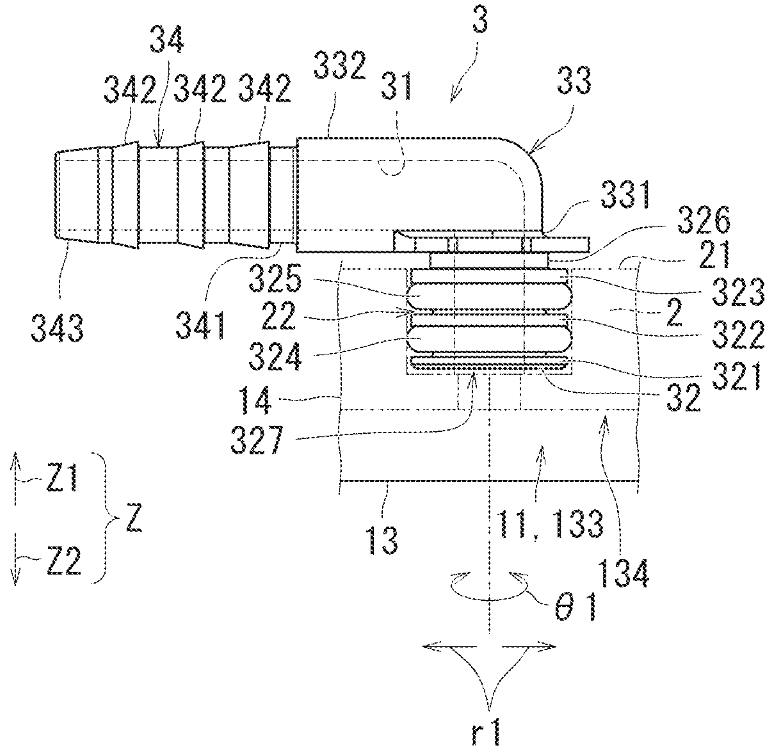
FIG. 8 is a side view of a joint 3 illustrated in FIG. 1.
Figure 9:
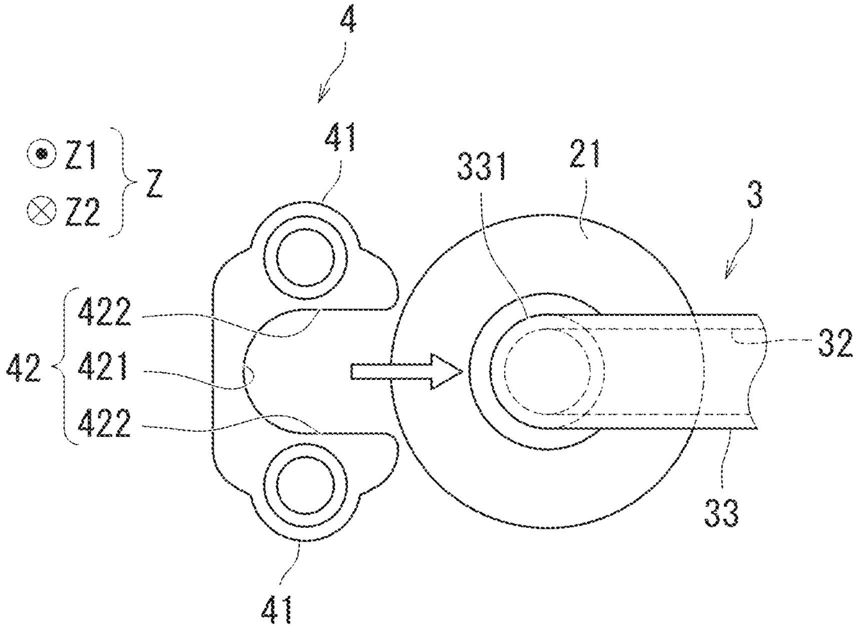
FIG. 9 is a plan view of a restricting portion 4 illustrated in FIG. 1.
Figure 10:
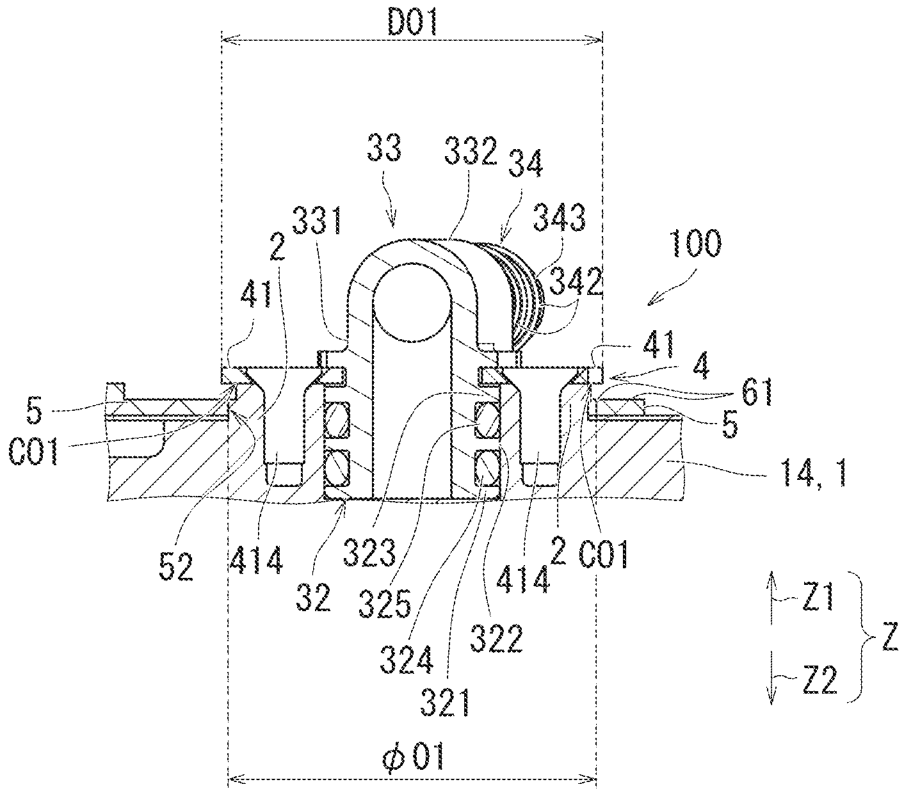
FIG. 10 is a schematic diagram illustrating an additional effect of a second portion 41 according to an example embodiment of the present disclosure.

Hereinafter, a more detailed configuration of the cooling device 100 will be described with reference to FIGS. 1 to 10. FIG. 7 is a plan view of a cold plate 13 illustrated in FIG. 1 as viewed from the one side Z1 of the first direction. FIG. 8 is a side view of the joint 3 illustrated in FIG. 1. FIG. 9 is a plan view of the restricting portion 4 illustrated in FIG. 1. FIG. 10 is a schematic diagram illustrating an additional effect of the second portion 41.

As illustrated in FIGS. 1 to 5, the main body 1 includes the cold plate 13 and a cover 14.

The cold plate 13 is made of a high thermal conductivity material. Examples of this type of material include metals such as copper and aluminum. In addition, the cold plate 13 can be manufactured from fine ceramics containing aluminum nitride or silicon carbide.

The cold plate 13 has a substantially rectangular parallelepiped outer shape that is thin in the Z direction. Specifically, as illustrated in FIG. 4, the cold plate 13 has a first surface 131 on the other side Z2 of the first direction. The first surface 131 can be in thermal contact with the heat source 200 (see FIG. 4). In the example embodiment, the first surface 131 intersects the first direction Z.

As illustrated in FIGS. 3 to 5, heat grease 137 is applied to a specific portion 136 (see broken lines in FIG. 3) on the first surface 131. The specific portion 136 is a portion surrounded by a broken line in FIG. 3. Specifically, the heat grease 137 is applied to a plurality of portions of the specific portion 136. The heat grease 137 is grease having high thermal conductivity. This facilitates heat dissipation from the heat source 200.

Specifically, the heat source 200 (see FIG. 4) is an electronic component. The electronic component is a component constituting electronic equipment, and includes, for example, a central processing unit (so-called CPU), an electrolytic capacitor, a power semiconductor module, or a printed circuit board. The electronic component operates by power supply and generates heat. Such an electronic component is cooled by the cooling device 100. The heat source 200 may be electronic equipment. The electronic equipment is a rack mounted server or a blade server. The electronic equipment may also be a projector, a personal computer, or a display.

As illustrated in FIG. 7, the cold plate 13 has a second surface 132 on the one side Z1 of the first direction. The second surface 132 is substantially parallel to the first surface 131.

The cold plate 13 has a bottomed recess 133 recessed from the central portion of the second surface 132 toward the first surface 131. The recess 133 has an opening 134 opened toward the one side Z1 in the first direction. In the recess 133, a plurality of fins 135 protrude from the bottom to the one side Z1 in the first direction. The plurality of fins 135 extend in the first direction Z and the second direction X. By including the fins 135, the cooling performance of the cooling device 100 is improved as compared with a case where the fins 135 are not included.

As illustrated in FIGS. 1 and 2, the cover 14 is made of resin, for example. The cover 14 is not limited to resin, and may be made of metal, for example.

The cover 14 has a substantially rectangular parallelepiped outer shape that is thin in the Z direction. Specifically, as illustrated in FIG. 5, the cover 14 is fixed to the cold plate 13 by a plurality of fixing members 141 (see FIG. 3) in a state where the opening 134 is closed. Each of the fixing members 141 is a screw. The recess 133 of the cold plate 13 and the cover 14 define the flow path 11 in the main body 1. In FIG. 3, a reference numeral "141" is attached to only one screw.

As illustrated in FIG. 5, specifically, the flow path 11 is a space through which the refrigerant can flow. The refrigerant is, for example, a coolant. Examples of the coolant include antifreeze liquid and pure water. A typical example of antifreeze liquid is an ethylene glycol aqueous solution or a propylene glycol aqueous solution.

As illustrated in FIGS. 1 and 2, the at least one protruding portion 2 is two protruding portions 2. The number of protruding portions 2 may be other than two. The hole 22 (see FIG. 5) reaching the flow path 11 extends from the end portion 21 of each of the protruding portions 2. Each end portion 21 has a flat surface extending in the second direction X and the third direction Y. Each hole 22 has, for example, a circular shape in a plan view from the one side Z1 of the first direction.

The joint 3 is provided corresponding to the protruding portion 2. Therefore, in the example embodiment, the number of the joints 3 is two. In the example embodiment, each joint 3 is a pipe joint having the same specification. However, the present disclosure is not limited thereto, and each joint 3 may be a pipe joint having different specifications.

As illustrated in FIG. 8, each joint 3 includes a spigot 32, a main body 33, and a spigot 34 in addition to the flow path 31 described above.

The spigot 32 is a tubular portion that is inserted into the hole 22. The spigot 32 extends in the first direction Z in a state of being inserted into the hole 22. The outer peripheral surface of the spigot 32 has a substantially cylindrical shape, and has an outer diameter smaller than the diameter of the hole 22 formed in the protruding portion 2. The spigot 32 has three flanges 321, 322, and 323 on the outer peripheral surface of the spigot 32.

The flanges 321 to 323 protrude from the outer peripheral surface of the spigot 32 in a radial direction r1 of the spigot 32. Each of the flanges 321 to 323 has a thin plate shape in the first direction Z, and extends in a circumferential direction θ1 of the spigot 32. Each of the flanges 321 to 323 is circular in plan view from the first direction Z. Each of the flanges 321 to 323 has substantially the same dimension as the hole 22 in the radial direction r1.

Among the flanges 321 to 323, the flange 321 is located closest to the other side Z2 of the first direction, and the flange 323 is located closest to the one side Z1 of the first direction. The flange 322 is located between the flanges 321 and 323. The flange 322 is spaced apart from both the flange 321 and the flange 323 in the first direction Z. An O-ring 324 is mounted between the flanges 321 and 322, and an O-ring 325 is mounted between the flanges 322 and 323. Each of the O-rings 324 and 325 has an outer diameter larger than the diameter of the hole 22 in the radial direction r1. Therefore, in a state where the spigot 32 is inserted into the hole 22, each of the O-rings 324 and 325 is in close contact with the peripheral surface of the hole 22.

In a state where the spigot 32 is inserted into the hole 22, the flow path 31 is connected to the flow path 11 so that the refrigerant can flow. When the spigot 32 is inserted into the hole 22, the end surface of the flange 323 on the one side Z1 of the first direction is substantially flush with the end surface of the protruding portion 2 on the one side Z1 of the first direction (that is, the end portion 21). In the example embodiment, the term flush means that a plurality of surfaces are substantially parallel to each other without a step.

The main body 33 is connected to, at a base end portion 331, an end portion 326 of the spigot 32 on the one side Z1 of the first direction. The main body 33 extends from the base end portion 331 in a direction intersecting the first direction Z.

The spigot 34 is connected to a tip portion 332 of the main body 33 at a base end 341 of the spigot 34. The tip portion 332 is an end portion of the main body 33 on the side opposite to the base end portion 331.

The spigot 34 protrudes straight from the tip portion 332 of the main body 33. The spigot 34 has a tubular shape. A refrigerant pipe (not shown) is attached to the spigot 34. On the outer peripheral surface of the spigot 34, projections 342 are formed to prevent the refrigerant pipe from coming off.

The flow path 31 extends from the end portion 327 of the spigot 32 on the other side Z2 of the first direction to the tip 343 of the spigot 34 via the spigot 32, the main body 33, and the spigot 34.

In the example embodiment, the main body 33 and the spigot 34 extend in a direction different from the direction of the spigot 32. However, the present disclosure is not limited thereto, and the main body 33 and the spigot 34 may extend in the same direction (that is, the first direction Z) as that of the spigot 32.

As illustrated in FIGS. 1 and 2, the restricting portion 4 is provided corresponding to the protruding portion 2. Therefore, in the example embodiment, the number of the restricting portions 4 is two. In the example embodiment, each of the restricting portions 4 has the same shape. However, the present disclosure is not limited thereto, and the restricting portions 4 may have different shapes.

The restricting portion 4 has a plate shape which is thin in the first direction Z in a state of being fixed to the end portion 21 (see FIG. 4). Specifically, the dimension of the restricting portion 4 in the first direction Z is equal to or smaller than the distance between the flange 323 and the main body 33 in the first direction Z.

As illustrated in FIG. 9, the restricting portion 4 has a U-shaped notch 42 in addition to the second portion 41 described above. Specifically, the notch 42 has an arcuate portion 421 and two straight line portions 422 in plan view from the first direction Z. The arcuate portion 421 has an arcuate shape having a central angle of 180° and a diameter substantially the same as that of the spigot 32. The two straight line portions 422 extend from both ends of the arcuate portion 421. The two straight line portions 422 are substantially parallel to each other.

In a state where the joint 3 is inserted into the hole 22, the notch 42 of the restricting portion 4 is inserted between the flange 323 (see FIG. 8) and the end portion 21, and the main body 33 (see FIG. 8). As a result, the outer peripheral surface of the end portion 326 (see FIG. 8) is surrounded by the arcuate portion 421 and the two straight line portions 422. The restricting portion 4 is fastened to the end portion 21 of the protruding portion 2 with two screws 414 (see FIG. 10). This prevents movement of the joint 3 in the first direction Z. Specifically, it allows the joint 3 to rotate in the circumferential direction θ1 (see FIG. 8) while suppressing the movement of the joint 3 in the first direction Z. As a result, the orientation of the tip of the spigot 34 can be adjusted. As a result, it is easy to route a tube (not illustrated) connected to the spigot 34 of the joint 3.

In the example embodiment, the number of the second portions 41 is two. Each of the second portions 41 is located on either side of the notch 42. Here, the two second portions 41 are positioned on the opposite sides over the spigot 32 of the joint 3 (see also FIG. 10). A distance D01 (see FIG. 10) between one protruding end of the second portion 41 and the other protruding end of the second portion 41 is larger than a diameter φ01 (see FIG. 10) of a hole 52 formed in the substrate 5. Therefore, even when the substrate 5 moves, at least one of the second portions 41 faces the substrate 5. Therefore, the substrate 5 is less likely to come off from the protruding portion 2.

In the example embodiment, as illustrated in FIGS. 1 and 2, the substrate 5 is provided corresponding to the protruding portion 2. Therefore, the number of the substrates 5 is two. The two substrates 5 may have the same shape or different shapes.

Each of the substrates 5 has the first portion 51 around the corresponding protruding portion 2 (see FIG. 6). A pair of two electrodes 61 is formed on each of the first portions 51 by printing, for example.

Each electrode 61 has a substantially annular shape. In each of the first portions 51, one electrode 61 is located along the outer peripheral surface of the protruding portion 2, and the other electrode 61 is located outside the one electrode 61 and spaced apart from the one electrode 61. That is, the pair of two electrodes 61 are electrically insulated. The pair of two electrodes 61 is formed only around the protruding portion 2. As a result, the substrate 5 is further downsized.

The controller 7 is mounted on one of the substrates 5 (that is, one of the two substrates 5), and is electrically connected to the pair of two electrodes 61 of each substrate 5.

In addition to the controller 7 and the pair of two electrodes 61, a connector 71 electrically connected to the electrodes 61 is mounted on one of the two substrates 5. In addition, a wiring 72 for electrically connecting the controller 7 and the connector 71 is formed on the one substrate 5.

Similarly, on the other substrate 5, in addition to the pair of two electrodes 61, a connector 71 electrically connected to the electrodes 61 is also mounted. On the other substrate 5, a wiring 73 for electrically connecting the electrodes 61 and the connector 71 is formed.

In addition, the connectors 71 are electrically connected to each other by the wiring 74.

When the cooling device 100 includes three or more substrates 5, the electrodes 61 mounted on each substrate 5 are electrically connected to the controller 7 via the connector 71 mounted on the same substrate 5.

Note that in a case where the cooling device 100 does not include the leak sensor 6, the controller 7 and the like may be subject to waterproof processing by a mold or the like. This prevents failure of the controller 7 and the like.

As illustrated in FIGS. 5 and 8, the refrigerant flows into the flow path 31 from the tip 343 of one of the two joints 3 (see arrow A11 in FIG. 5), flows through the flow path 31, and flows out from one end portion 327 of the joint 3 (see arrow A12). Thereafter, the refrigerant flows to the one side X1 of the second direction and the other side X2 of the second direction along the fin 135 in the flow path 11 (see arrows A13 and A14 in FIG. 5), and flows from an end portion 327 of the other joint 3 into the flow path 31 of the other joint 3 (see arrow A15). Thereafter, the refrigerant flows through the flow path 31 of the other joint 3 and flows out from the other end portion 327 of the joint 3 (see arrow A16). While the refrigerant flows through the flow path 11, heat is exchanged between the refrigerant and the heat source 200. As a result, the heat source 200 is cooled.

According to the present example embodiment, it is possible to provide the cooling device 100 capable of easily detecting liquid leakage from the joint 3. Specifically, in the cooling device 100, for example, the refrigerant may leak from a gap between the hole 22 of the protruding portion 2 and the flange 323 of the joint 3. The leaking refrigerant may flow between the two electrodes 61 formed on each substrate 5 along the end portion 21 and the outer peripheral surface of the protruding portion 2. The controller 7 measures an electric resistance value between the two electrodes 61 formed on each substrate 5. When the refrigerant flows between the two electrodes 61 and the electric resistance value becomes equal to or less than the reference value, the controller 7 detects liquid leakage. It is also conceivable that the refrigerant leaks from a space other than the gap between the hole 22 and the flange 323 and reaches between the two electrodes 61. Therefore, the leak sensor 6 can detect not only liquid leakage from the gap between the hole 22 and the flange 323 but also liquid leakage from other portions. In addition, by appropriately changing the area occupied by the electrode 61 on the substrate 5 and/or the shape of the electrode 61, the size of the liquid leakage detection region by the leak sensor 6 can be appropriately adjusted.

In the absence of the second portion 41, the refrigerant leaking from the gap between the protruding portion 2 and the joint 3 may enter the gap between the substrate 5 and the protruding portion 2 along the outer peripheral surface of the protruding portion 2. As a result, detection of liquid leakage in the controller 7 may be delayed. On the other hand, as illustrated in FIG. 10, when there is the second portion 41, the refrigerant tends to accumulate at a corner C01 between the protruding portion 2 and the second portion 41 due to surface tension. That is, the refrigerant is less likely to enter the gap between the substrate 5 and the protruding portion 2. Therefore, the refrigerant easily flows toward the part between the pair of two electrodes 61. This improves detection accuracy of liquid leakage in the controller 7. Furthermore, even when a small amount of refrigerant leaks from the gap, the controller 7 can detect liquid leakage through the leak sensor 6.

Figure 11:
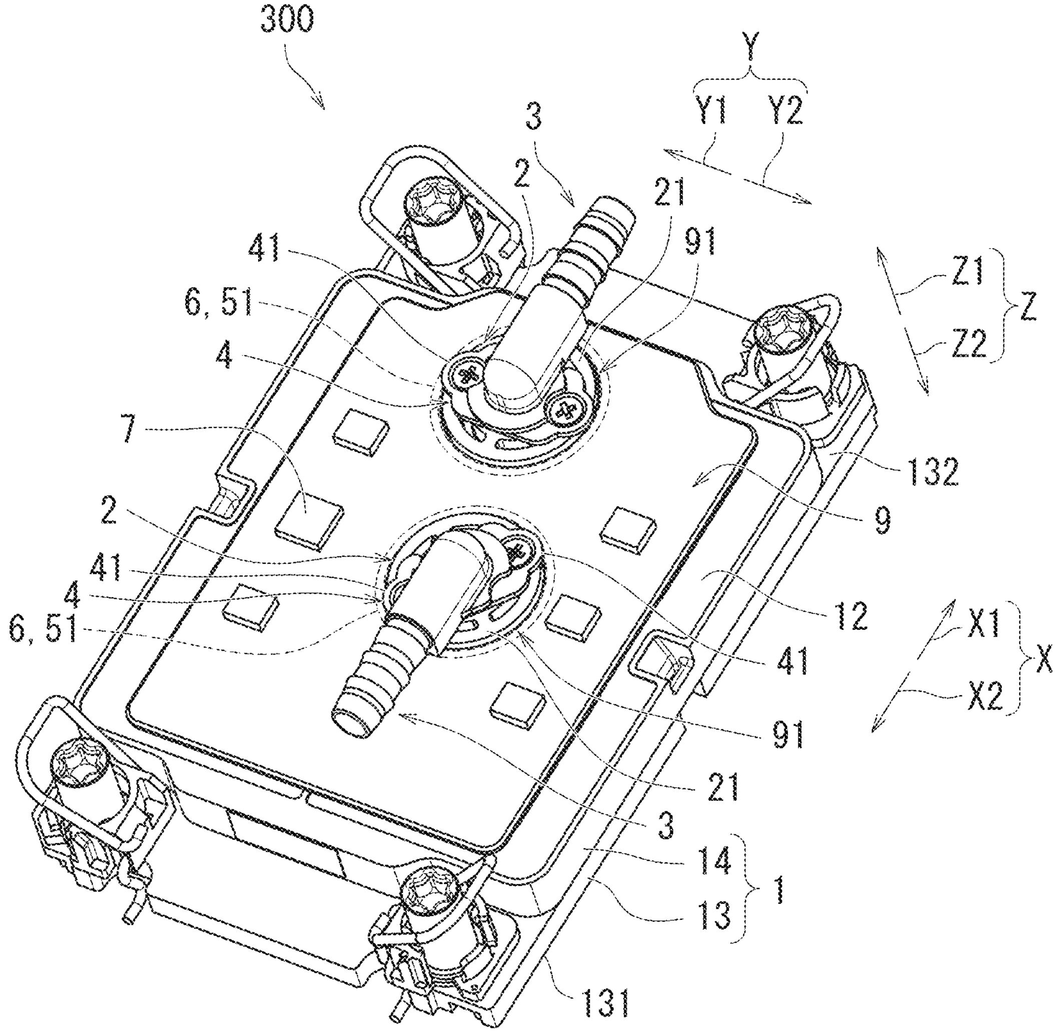
FIG. 11 is a perspective view of a cooling device according to a modification of an example embodiment of the present disclosure.

FIG. 11 is a perspective view illustrating a cooling device 300 according to a modification of the example embodiment. As illustrated in FIG. 11, the cooling device 300 is different from the cooling device 100 illustrated in FIG. 1 in that one substrate 9 is provided instead of the plurality of substrates 5. The substrate 9 is located on one surface 12 and has a plurality of holes 91 through which a plurality of protruding portions 2 penetrate. Since only one substrate 9 is required, the assembly work of the cooling device 300 is simplified.

The substrate 9 is further different from the substrate 5 in that the first portion 51 is provided around each hole 91 and that the substrate 9 spreads over substantially the entire area (that is, a relatively wide range) of the one surface 12. Since the substrate 9 spreads over a wide range, the electrode 61 of the leak sensor 6 can also be formed over a wide range on the substrate 9. This further improves the detection accuracy of liquid leakage by the controller 7.

The drawings schematically show each component mainly in order to facilitate understanding of the present disclosure, and the thickness, length, number, interval, and the like of each component that is shown may be different from the actual ones for convenience of the drawings. The configuration of each component shown in the above example embodiment is an example and is not particularly limited, and it goes without saying that various modifications can be made without substantially departing from the effects of the present disclosure.

In the example embodiment and the modification, the mounting surface of the controller 7 in the substrates 5 and 9 is located at the other side Z2 of the first direction than the end portion 21. However, the present disclosure is not limited to this, and the mounting surface of the controller 7 in the substrates 5 and 9 may be located at the one side Z1 of the first direction than the end portion 21. However, in this case, the second portion 41 needs to protrude from the restricting portion 4 in the first direction Z and be bent in the second direction X or the third direction Y.

In the example embodiment and the modification, the controller 7 can transmit, that is, notify, the detection result of liquid leakage to an external device of the cooling device 100 by wired communication or wireless communication.

The present technology can also adopt the following configurations.

(1) A cooling device including a main body that is thermally contactable with a heat source and includes a flow path for refrigerant, a protruding portion that protrudes from one surface of the main body to one side in a predetermined direction and includes a hole extending from an end portion on the one side in the predetermined direction to the flow path, a joint that is inserted into the hole and includes a flow path connected to the flow path of the main body, a restricting portion that is fixed to the end portion and restricts movement of the joint, a substrate located on the one surface, and a leak sensor mounted on the substrate and capable of detecting liquid leakage, in which the substrate includes a first portion located on the one surface and positioned around the protruding portion, and the restricting portion includes a second portion that protrudes from the end portion of the protruding portion in an intersecting direction intersecting the predetermined direction, on the one side in the predetermined direction with respect to the first portion.

(2) The cooling device according to (1), in which the end portion is located on the one side in the predetermined direction with respect to the substrate.

(3) The cooling device according to (1) or (2), in which the substrate includes a hole through which the protruding portion penetrates.

(4) The cooling device according to any one of (1) to (3), in which the first portion and the second portion oppose each other in the predetermined direction.

(5) The cooling device according to any one of (1) to (4), in which the restricting portion includes a plurality of the second portions.

(6) A cooling device including a main body that is thermally contactable with a heat source and includes a flow path through which refrigerant flows, a plurality of protruding portions each of which protrudes from one surface of the main body to one side in a predetermined direction and includes a hole extending from an end portion on the one side in the predetermined direction to the flow path, a plurality of joints each of which is inserted into a corresponding one of a plurality of the holes and includes a plurality of flow paths each of which is connected to the flow path of the main body, a plurality of restricting portions each of which is fixed to corresponding one of a plurality of the end portions and restricts movement of each of the plurality of joints, a plurality of substrates located on the one surface, and a leak sensor mounted on the plurality of substrates and capable of detecting liquid leakage, in which each of the plurality of substrates includes a first portion that is positioned on the one surface and around each of the protruding portions, and each of the plurality of restricting portions includes second portions that protrude from the end portions of the plurality of protruding portions in intersecting direction intersecting the an predetermined direction, on the one side in the predetermined direction with respect to the first portion.

(7) The cooling device according to (6), further comprising a controller that is mounted on one of the plurality of substrates and controls the leak sensor.

(8) The cooling device according to (6) or (7), in which an electrode included in the leak sensor is on one of the plurality of substrates.

(9) The cooling device according to any one of (6) to (8), in which the electrode is on the one surface and around the protruding portion in one of the plurality of substrates, and the controller is spaced away from the electrode on the one surface of one of the plurality of substrates.

(10) A cooling device including a main body that is thermally contactable with a heat source and includes a flow path through which refrigerant flows, a plurality of protruding portions each of which protrudes from one surface of the main body to one side in a predetermined direction and includes a hole extending from an end portion on the one side in the predetermined direction to the flow path, a plurality of joints each of which is inserted into a corresponding one of a plurality of the holes and includes a plurality of flow paths each of which is connected to the flow path of the main body, a plurality of restricting portions each of which is fixed to corresponding one of a plurality of the end portions and restricts movement of each of the plurality of joints, and a substrate located on the one surface and includes a plurality of holes through which the plurality of protruding portions penetrates, and a leak sensor mounted on the substrate and capable of detecting liquid leakage, in which each of a plurality of the substrates includes a first portion that is positioned on the one surface and around each of the protruding portions, and each of the plurality of restricting portions includes second portions that protrude from the end portions of the plurality of protruding portions in an intersecting direction intersecting the predetermined direction, on the one side in the predetermined direction with respect to the first portion.

Example embodiments of the present disclosure are applicable to, for example, cooling devices to cool a server.

Features of the above-described example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A cooling device comprising:

a main body that is thermally contactable with a heat source and includes a flow path for refrigerant;

a protruding portion that protrudes from one surface of the main body to one side in a predetermined direction and includes a hole extending from an end portion on the one side in the predetermined direction to the flow path;

a joint that is inserted into the hole and includes a flow path connected to the flow path of the main body;

a restricting portion that is fixed to the end portion and restricts movement of the joint;

a substrate located on the one surface; and a leak sensor mounted on the substrate and capable of detecting liquid leakage; wherein the substrate includes a first portion located on the one surface and positioned around the protruding portion; and the restricting portion includes a second portion that protrudes from the end portion of the protruding portion in an intersecting direction intersecting the predetermined direction, on the one side in the predetermined direction with respect to the first portion.

2. The cooling device according to claim 1, wherein the end portion is located on the one side in the predetermined direction with respect to the substrate.

3. The cooling device according to claim 1, wherein the substrate includes a hole through which the protruding portion penetrates.

4. The cooling device according to claim 1, wherein the first portion and the second portion oppose each other in the predetermined direction.

5. The cooling device according to claim 1, wherein the restricting portion includes a plurality of the second portions.

6. A cooling device comprising:

a main body that is thermally contactable with a heat source and includes a flow path through which refrigerant flows;

a plurality of protruding portions each of which protrudes from one surface of the main body to one side in a predetermined direction and includes a hole extending from an end portion on the one side in the predetermined direction to the flow path;

a plurality of joints each of which is inserted into a corresponding one of a plurality of the holes and includes a plurality of flow paths each of which is connected to the flow path of the main body;

a plurality of restricting portions each of which is fixed to corresponding one of a plurality of the end portions and restricts movement of each of the plurality of joints;

a plurality of substrates located on the one surface; and a leak sensor mounted on the plurality of substrates and capable of detecting liquid leakage; wherein each of the plurality of substrates includes a first portion that is positioned on the one surface and around each of the protruding portions; and each of the plurality of restricting portions includes second portions that protrude from the end portions of the plurality of protruding portions in an intersecting direction intersecting the predetermined direction, on the one side in the predetermined direction with respect to the first portion.

7. The cooling device according to claim 6, further comprising a controller that is mounted on one of the plurality of substrates and controls the leak sensor.

8. The cooling device according to claim 7, wherein an electrode included in the leak sensor is on one of the plurality of substrates.

9. The cooling device according to claim 8, wherein the electrode is on the one surface and around the protruding portion in one of the plurality of substrates; and the controller is spaced away from the electrode on the one surface of one of the plurality of substrates.

10. A cooling device comprising:

a main body that is thermally contactable with a heat source and includes a flow path through which refrigerant flows;

a plurality of protruding portions each of which protrudes from one surface of the main body to one side in a predetermined direction and includes a hole extending from an end portion on the one side in the predetermined direction to the flow path;

a plurality of joints each of which is inserted into a corresponding one of a plurality of the holes and includes a plurality of flow paths each of which is connected to the flow path of the main body;

a plurality of restricting portions each of which is fixed to corresponding one of a plurality of the end portions and restricts movement of each of the plurality of joints; and a substrate located on the one surface and includes a plurality of holes through which the plurality of protruding portions penetrate; and a leak sensor mounted on the substrate and capable of detecting liquid leakage; wherein each of a plurality of the substrates includes a first portion that is positioned on the one surface and around each of the protruding portions; and each of the plurality of restricting portions includes second portions that protrude from the end portions of the plurality of protruding portions in an intersecting direction intersecting the predetermined direction, on the one side in the predetermined direction with respect to the first portion.

* * * * *